United States Patent
Olson et al.

(10) Patent No.: US 8,598,467 B2
(45) Date of Patent: Dec. 3, 2013

(54) MULTI-LAYER CIRCUIT ASSEMBLY AND PROCESS FOR PREPARING THE SAME

(75) Inventors: Kevin C. Olson, Wexford, PA (US); Alan G. Wang, Shanghai (CN)

(73) Assignee: PPG Industries Chio, Inc., Cleveland, OH (US)

( * ) Notice: Subject to any disclaimer, the term of this patent is extended or adjusted under 35 U.S.C. 154(b) by 22 days.

(21) Appl. No.: 13/275,808

(22) Filed: Oct. 18, 2011

(65) Prior Publication Data

US 2012/0031655 A1 Feb. 9, 2012

Related U.S. Application Data

(60) Division of application No. 11/760,217, filed on Jun. 8, 2007, now Pat. No. 8,065,795, which is a division of application No. 10/291,876, filed on Nov. 8, 2002, now Pat. No. 7,228,623, which is a continuation-in-part of application No. 09/901,373, filed on Jul. 9, 2001, now Pat. No. 6,671,950, which is a continuation-in-part of application No. 09/851,904, filed on May 9, 2001, now abandoned, which is a continuation-in-part of application No. 09/802,001, filed on Mar. 8, 2001, now abandoned.

(51) Int. Cl.
*H05K 1/11* (2006.01)

(52) U.S. Cl.
USPC .................................................. 174/262

(58) Field of Classification Search
USPC .................... 174/262–266; 361/792–795
See application file for complete search history.

(56) References Cited

U.S. PATENT DOCUMENTS

| | | |
|---|---|---|
| 3,451,793 A | 6/1969 | Matsushita |
| 3,469,982 A | 9/1969 | Celeste |
| 3,738,835 A | 6/1973 | Bakos |
| 3,934,334 A | 1/1976 | Hanni |
| 4,137,211 A | 1/1979 | Angelo et al. |
| 4,343,885 A | 8/1982 | Reardon, Jr. |
| 4,378,264 A | 3/1983 | Pilette et al. |
| 4,457,956 A | 7/1984 | Park |
| 4,592,816 A | 6/1986 | Emmons et al. |
| 5,129,142 A | 7/1992 | Bindra et al. |
| 5,153,986 A | 10/1992 | Brauer et al. |
| 5,166,037 A | 11/1992 | Atkinson et al. |
| 5,224,265 A | 7/1993 | Dux et al. |
| 5,229,550 A | 7/1993 | Bindra et al. |
| 5,232,548 A | 8/1993 | Ehrenberg et al. |
| 5,242,780 A | 9/1993 | Lin et al. |
| 5,291,066 A | 3/1994 | Neugebauer et al. |
| 5,298,685 A | 3/1994 | Bindra et al. |
| 5,316,787 A | 5/1994 | Frankeny et al. |
| 5,319,158 A | 6/1994 | Lee et al. |
| 5,374,344 A | 12/1994 | Gall et al. |
| 5,435,057 A | 7/1995 | Bindra et al. |
| 5,574,630 A | 11/1996 | Kresge et al. |
| 5,590,460 A | 1/1997 | DiStefano et al. |
| 5,600,035 A | 2/1997 | Kahle et al. |
| 5,879,808 A | 3/1999 | Wary et al. |
| 5,903,428 A | 5/1999 | Grimard et al. |
| 6,030,693 A | 2/2000 | Boyko et al. |
| 6,105,243 A | 8/2000 | Okabe et al. |
| 6,150,284 A | 11/2000 | Kawahara |
| 6,266,874 B1 | 7/2001 | DiStefano et al. |
| 6,365,844 B2 | 4/2002 | Nishii et al. |
| 6,427,325 B1 | 8/2002 | Johansson et al. |
| 6,434,819 B1 | 8/2002 | Rokugawa |

FOREIGN PATENT DOCUMENTS

| | | |
|---|---|---|
| EP | 0 523 479 | 1/1993 |
| WO | 98/20559 | 5/1998 |
| WO | 02/073685 | 9/2002 |

OTHER PUBLICATIONS

"Parylene Specifications and Properties," Speedline Technologies, Product Literature, 2000.

Beach, W.F., Xylylene Polymers, Kirk-Othmer Encylopedia of Chemical Technology, Supplement Volume, 1998, pp. 863-901, John Wiley & Sons, New York, New York 10158-0012, United States of America.

*Primary Examiner* — Jeremy Norris
(74) *Attorney, Agent, or Firm* — Robert P. Lenart

(57) ABSTRACT

A process for fabricating a multi-layer circuit assembly is provided. The process includes (a) providing a substrate at least one area of which comprises a plurality of vias area(s) having a via density of 500 to 10,000 holes/square inch (75 to 1550 holes/square centimeter); (b) applying a dielectric coating onto all exposed surfaces of the substrate to form a conformal coating thereon; (c) removing the dielectric coating in a predetermined pattern to expose sections of the substrate; (d) applying a layer of metal to all surfaces to form metallized vias through and/or to the electrically conductive core; (e) applying a resist to the metal layer to form a photosensitive layer thereon; (f) imaging resist in predetermined locations; (g) developing resist to uncover selected areas of the metal layer; and (h) etching uncovered areas of metal to form an electrical circuit pattern connected by the metallized vias.

16 Claims, No Drawings

MULTI-LAYER CIRCUIT ASSEMBLY AND PROCESS FOR PREPARING THE SAME

CROSS-REFERENCE TO RELATED APPLICATION

This patent application is a Division of U.S. application Ser. No. 11/760,217 filed Jun. 8, 2007, which is a Division of U.S. application Ser. No. 10/291,876 filed Nov. 8, 2002, which is a Continuation-in-Part of U.S. patent application Ser. No. 09/901,373 filed Jul. 9, 2001; which is a Continuation-in-Part of U.S. patent application Ser. No. 09/851,904 filed May 9, 2001, which is a Continuation-in-Part of U.S. patent application Ser. No. 09/802,001 filed Mar. 8, 2001, all of which are incorporated herein by reference.

BACKGROUND OF THE INVENTION

I. Field of the Invention

The present invention relates to the field of electronic circuitry, and in particular to multi-layer circuit assemblies such as chip scale packages, and the preparation thereof.

II. Technical Considerations

Electrical components, for example, resistors, transistors, and capacitors, are commonly mounted on circuit panel structures such as printed circuit boards. Circuit panels ordinarily include a generally flat sheet of dielectric material with electrical conductors disposed on a major, flat surface of the sheet, or on both major surfaces. The conductors are commonly formed from metallic materials such as copper and serve to interconnect the electrical components mounted to the board. Where the conductors are disposed on both major surfaces of the panel, the panel may have via conductors extending through holes (or "through vias") in the dielectric layer so as to interconnect the conductors on opposite surfaces. Multilayer circuit panel assemblies have been made heretofore which incorporate multiple stacked circuit panels with additional layers of dielectric materials separating the conductors on mutually facing surfaces of adjacent panels in the stack. These multi-layer assemblies ordinarily incorporate interconnections extending between the conductors on the various circuit panels in the stack as necessary to provide the required electrical interconnections.

In microelectronic circuit packages, circuits and units are prepared in packaging levels of increasing scale. Generally, the smallest scale packaging levels are typically semiconductor chips housing multiple microcircuits and/or other components. Such chips are usually made from ceramics, silicon, and the like. Intermediate package levels (i.e., "chip carriers") comprising multi-layer substrates may have attached thereto a plurality of small-scale chips housing many microelectronic circuits. Likewise, these intermediate package levels themselves can be attached to larger scale circuit cards, motherboards, and the like. The intermediate package levels serve several purposes in the overall circuit assembly including structural support, transitional integration of the smaller scale microcircuits and circuits to larger scale boards, and the dissipation of heat from the circuit assembly. Substrates used in conventional intermediate package levels have included a variety of materials, for example, ceramic, fiberglass reinforced polyepoxides, and polyimides.

The aforementioned substrates, while offering sufficient rigidity to provide structural support to the circuit assembly, typically have thermal coefficients of expansion much different than that of the microelectronic chips to be attached to them. As a result, failure of the circuit assembly after repeated use is a risk due to failure of adhesive joints between the layers of the assembly.

Likewise, dielectric materials used on the substrates must meet several requirements, including conformality, flame resistance, and compatible thermal expansion properties. Conventional dielectric materials include, for example, polyimides, polyepoxides, phenolics, and fluorocarbons. These polymeric dielectrics typically have thermal coefficients of expansion much higher than that of the adjacent layers.

There has been an increasing need for circuit panel structures which provide high density, complex interconnections. Such a need can be addressed by multi-layer circuit panel structures, however, the fabrication of such multi-layer circuit assemblies has presented serious drawbacks.

Generally multi-layer panels are made by providing individual, dual sided circuit panels including appropriate conductors. The panels are then laminated one atop the other with one or more layers of uncured or partially cured dielectric material, commonly referred to as "prepregs" disposed between each pair of adjacent panels. Such a stack ordinarily is cured under heat and pressure to form a unitary mass. After curing, holes typically are drilled through the stack at locations where electrical connections between different boards are desired. The resulting holes or "through vias" are then coated or filled with electrically conductive materials usually by plating the interiors of the holes to form a plated through via. It is difficult to drill holes with a high ratio of depth to diameter, thus the holes used in such assemblies must be relatively large and consume a great deal of space in the assembly.

U.S. Pat. No. 6,266,874 B1 discloses of method of making a microelectronic component by providing a conductive substrate or "core"; providing a resist at selected locations on the conductive core; and electrophoretically depositing an uncured dielectric material on the conductive core except at locations covered by the resist. The reference suggests that the electrophoretically deposited material can be a cationic acrylic- or cationic epoxy-based composition as those known in the art and commercially available. The electrophoretically deposited material then is cured to form a conformal dielectric layer, and the resist is removed so that the dielectric layer has openings extending to the conductive core at locations which had been covered by the resist. The holes thus formed and extending to the coated substrate or "core" are commonly referred to as "blind vias". In one embodiment, the structural conductive element is a metal sheet containing continuous through holes or "through vias" extending from one major surface to the opposite major surface. When the dielectric material is applied electrophoretically, the dielectric material is deposited at a uniform thickness onto the conductive element surface and the hole walls. It has been found, however, that the electrophoretically deposited dielectric materials suggested by this reference can be flammable, and thus do not meet typical flame retardancy requirements.

U.S. Pat. Nos. 5,224,265 and 5,232,548 disclose methods of fabricating multi-layer thin-film wiring structures for use in circuit assemblies. The dielectric applied to the core substrate is preferably a fully cured and annealed thermoplastic polymer such as polytetrafluoroethylene, polysulfone, or polyimide-siloxane, preferably applied by lamination. Such dielectrics are not necessarily applied as conformal coatings, and may not have dielectric constants or dissipation factors low enough to accommodate the high frequencies of circuit systems currently being designed for the electronics market today. Moreover, dielectric properties of conventional dielectric coatings have been known to degrade at high frequencies.

While the above-identified references disclose through holes ("vias") in the wiring structures, there is no appreciation in the references of the need for a relatively high via density. High via density allows for a high number of chip connections, as may be required in a highly functional chip scale package for applications such as cellular phones and the like.

It should be noted that high via density in a circuit layer is critical for the operation of a circuit system having a high number of chip connections; however, high via density also contributes to crosstalk. Therefore, a circuit package designed with high via density needs to be fabricated using a very effective dielectric that does not degrade at high frequencies.

U.S. Pat. No. 5,153,986 discloses a method of fabricating metal core layers for a multi-layer circuit board. Suitable dielectrics include vapor-depositable conformal polymeric coatings. The method uses solid metal cores and the reference describes in broad, generic terms circuitization of the substrate. Circuitization of intermediate package levels is conventionally performed by applying a positive- or negative-acting photoresist to the metallized substrate, followed by exposure, development, and stripping to yield a desired circuit pattern. Photoresist compositions are typically applied by laminating, spraying, or immersion. The photoresist layer thus applied may have a thickness of 5 microns to 50 microns.

In addition to the ceramic, fiberglass reinforced polyepoxides, and polyimides mentioned above, conventional substrates used in intermediate package levels further include solid metal sheets such as are disclosed in U.S. Pat. No. 5,153,986. These solid substrates must be perforated during fabrication of the circuit assembly to provide through holes for alignment purposes. Again, while the reference discloses vias in the circuit layers, there is no appreciation of the need for a relatively high via density to accommodate highly functionalized chips.

In view of the prior art processes, it would be desirable to provide a process for preparing a multi-layer circuit assembly that overcomes the drawbacks of the prior art. That is, it would be desirable to provide a process for preparing a multi-layer circuit assembly with high via density to accommodate highly functional components, using an effective dielectric that does not degrade at high frequencies and meets further requirements including conformality and flame resistance.

SUMMARY OF THE INVENTION

One embodiment provides, a process for fabricating a multi-layer circuit assembly including the following steps:
(a) providing a substrate at least one area of which comprises a plurality of vias area(s) having a via density of 500 to 10,000 holes/square inch (75 to 1550 holes/square centimeter);
(b) applying a dielectric coating onto all exposed surfaces of the substrate to form a conformal coating thereon;
(c) removing the dielectric coating in a predetermined pattern to expose sections of the substrate;
(d) applying a layer of metal to all surfaces to form metallized vias through and/or to the electrically conductive core;
(e) applying a resist to the metal layer to form a photosensitive layer thereon;
(f) imaging resist in predetermined locations;
(g) developing resist to uncover selected areas of the metal layer; and
(h) etching uncovered areas of metal to form an electrical circuit pattern connected by the metallized vias.

In another embodiment, a multi-layer circuit assembly includes:
(a) a substrate at least one area of which comprises a plurality of vias, said area having a via density of 500 to 10,000 holes/square inch (75 to 1550 holes/square centimeter);
(b) a dielectric coating applied onto all exposed surfaces of the substrate;
(c) a layer of metal applied to all surfaces of substrate of step (b); and
(d) a photosensitive layer applied to the metal layer.

DETAILED DESCRIPTION OF THE INVENTION

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10.

As aforementioned, in one embodiment the present invention is directed to a process for fabricating a multi-layer circuit assembly comprising the following steps: (a) providing a substrate at least one area of which comprises a plurality of vias, said area(s) having a via density of 500 to 10,000 holes/square inch (75 to 1550 holes/square centimeter); (b) applying a dielectric coating onto all exposed surfaces of the substrate to form a conformal coating thereon; and (c) applying a layer of metal to all surfaces of the substrate.

The substrate (or "core") can comprise any of a variety of substrates. The substrate used in processes for the fabrication of the multi-layer circuit assembly of the present invention typically is an electrically conductive substrate, particularly a metal substrate, for example, untreated or galvanized steel, aluminum, gold, nickel, copper, magnesium or alloys of any of the foregoing metals, as well as conductive carbon coated materials. Also, the core has two major surfaces and edges and can have a thickness ranging from 10 to 100 microns, typically from 25 to 100 microns.

In an embodiment of the present invention, the substrate comprises a metal substrate selected from copper foil, iron-nickel alloys, and combinations thereof. In one embodiment of the present invention, the substrate comprises a perforate substrate comprised of any of the previously mentioned metals or combinations thereof In one embodiment of the present invention, the substrate comprises a perforate copper foil. In an alternative embodiment, the substrate comprises a nickel-iron alloy. A preferred iron-nickel alloy is INVAR, (trademark owned by Imphy S. A., 168 Rue de Rivoli, Paris, France) comprising approximately 64 weight percent iron and 36 weight percent nickel. This alloy has a low coefficient of thermal expansion, comparable to that of silicon materials used to prepare chips. This property is desirable in order to prevent failure of adhesive joints between successively larger or smaller scale layers of a chip scale package, due to thermal cycling during normal use.

As previously mentioned, at least one area of the substrate comprises a plurality of vias, the area(s) having a via density of 500 to 10,000 holes/square inch (75 to 1550 holes/square centimeter), and typically at least 2500 holes/square inch (387.5 holes/square centimeter). That is, the substrate can be a sheet of any of the aforementioned substrate materials, wherein only some areas are perforated and some areas are non-perforated; Alternatively, the substrate can be a "perforate" of any of the previously mentioned substrate materials. For purposes of the present invention, all that is required is that at least one area of the substrate has the specified via density.

By a "perforate" substrate is meant a mesh sheet having a plurality of holes spaced at regular intervals. Typically the holes (or vias) are of uniform size and shape. When the holes are circular, which is typical, the diameter of the holes is about 8 mil (203.2 microns). The holes may be larger or smaller as necessary, with the proviso that a hole is large enough to accommodate all the layers applied in the process of the present invention without becoming obstructed. The spacing of the holes is about 20 mils (508 microns) center-to-center, but again may be larger or smaller as necessary.

Prior to the application of the dielectric coating in step (b) described below, a layer of metal, usually copper, may be applied to the substrate to ensure optimum electrical conductivity. This layer of metal, as well as that applied in subsequent metallization steps, can be applied by conventional means, for example, by electroplating, metal vapor deposition techniques, and electroless plating. The layer of metal typically has a thickness of from 1 to 10 microns.

As previously discussed, a dielectric coating is applied to all exposed surfaces of the substrate to form a conformal coating thereon. As used herein, in the specification and in the claims, by "conformal" film or coating is meant a film or coating having a substantially uniform thickness which conforms to the substrate topography, including the surfaces within (but, preferably, not occluding) the holes. The dielectric coating film thickness may be no more than 50 microns, usually no more than 25 microns, and typically no more than 20 microns. A lower film thickness is desirable for a variety of reasons. For example, a dielectric coating having a low film thickness allows for smaller scale circuitry.

The dielectric coating can have a dielectric constant of no more than 4.00, sometimes no more than 3.50, often no more than 3.30, usually no more than 3.00, and typically no more than 2.80. Also, the cured film typically has a dielectric loss factor of less than or equal to 0.02, usually less than or equal to 0.15, and can be less than or equal to 0.01. Also, a coating have a low dielectric constant can allow for a dielectric coating having lower film thickness and the concomitant advantages thereof, and also minimizes capacitive coupling between adjacent signal traces.

A dielectric material is a non-conducting substance or insulator. The "dielectric constant" is an index or measure of the ability of a dielectric material to store an electric charge. The dielectric constant is directly proportional to the capacitance of a material, which means that the capacitance is reduced if the dielectric constant of a material is reduced. A low dielectric material is desired for high frequency, high speed digital application where the capacitances of substrates and coatings are critical to the reliable functioning of circuits. For example, present computer operations are limited by coupling capacitance between circuit paths and integrated circuits on multi-layer assemblies since computing speed between integrated circuits is reduced by this capacitance and the power required to operate is increased. See Thompson, Larry F., et al., *Polymers for Microelectronics*, presented at the 203$^{rd}$ National Meeting of American Chemical Society, Apr. 5-10, 1992.

The "dielectric loss factor" is the power dissipated by a dielectric material as the friction of its molecules opposes the molecular motion produced by an alternating electric field. See I. Gilleo, Ken, *Handbook of Flexible Circuits*, at p. 242, Van Nostrand Reinhold, New York (1991). See also, James J. Licari and Laura A. Hughes, *Handbook of Polymer Coatings for Electronics*, pp. 114-18, 2$^{nd}$ ed., Noyes Publication (1990) for a detailed discussion of dielectric materials and dielectric constant.

For purposes of the present invention, the dielectric constant of the dielectric coating is determined at a frequency of 1 megahertz using electrochemical impedance spectroscopy as follows. The coating sample is prepared by application of the dielectric coating composition to a steel substrate with subsequent drying or curing of the coating, to provide a dielectric coating having a film thickness of 0.85 mil (20.83 microns). A 32 square centimeter free film of the dielectric coating is placed in the electrochemical cell with 150 milliliters of electrolyte solution (1 M NaCl) and allowed to equilibrate for one hour. An AC potential of 100 mV is applied to the sample and the impedance is measured from 1.5 megahertz to 1 hertz frequency range. The method employs a platinum-on-niobium expanded mesh counter electrode and a single junction silver/silver chloride reference electrode. The dielectric constant of the coating can be determined by calculating the capacitance at 1 megahertz, 1 kilohertz, and 63 hertz, and solving the following equation for E.

$$C = E_o E A / d$$

where C is the measured capacitance at discrete frequency (in Farads); $E_o$ is the permitivity of free space ($8.854187817^{12}$); A is the sample area (32 square centimeters; d is the coating thickness; and E is the dielectric constant. It should be noted the values for dielectric constant as used in the specification and in the claims is the dielectric constant determined as described above at a frequency of 1 megahertz. Likewise, values for the dielectric loss factor are determined as the difference between the dielectric constant measured at a frequency of 1 megahertz as described above, and the dielectric constant for the same material measured at a frequency of 1.1 megahertz.

The dielectric coating can be formed from any of a variety of coating compositions as discussed below. The dielectric coating can be formed from a thermoplastic composition where, once applied, solvents (i.e., organic solvents and/or water) are driven off or evaporated, thereby forming a film of the dielectric coating on the substrate. The dielectric coating also can be formed from a curable or thermosetting composition where once the composition is applied to the substrate and cured, a cured film of the dielectric coating is formed. The dielectric coating can be any coating applied by any coating application technique provided that the resultant coating is a conformal coating having a sufficiently low dielectric constant to ensure sufficient insulating properties, and flame resistance properties as determined in accordance with IPC-TM-650, Test Methods Manual, Number 2.3.10, "Flammability of Laminate", Revision B, available from the Institute of Interconnecting and Packaging Electronic Circuits, 2215 Sanders Road, Northbrook, Ill.

The dielectric coating used in the process of the present invention may be applied by any suitable conformal coating method including, for example, dip coating, vapor deposition, electrodeposition and autophoresis.

Examples of dielectric coatings applied by vapor deposition include poly-(para-xylylenes)(encompassing both substituted and unsubstituted poly-(para-xylylene)); silsesquioxanes, such as those disclosed in U.S. Pat. Nos. 5,711,987 and 6,144,106; poly-benzocyclobutene and polyimide.

Examples of dielectric coatings applied by electrodeposition include anodic and cathodic acrylic, epoxy, polyester, polyurethane, polyimide or oleoresinous compositions, as are well known to those skilled in the art. The dielectric coating also can be formed by the electrodeposition of any of the electrodepositable photosensitive compositions described below.

In a particular embodiment of the present invention, the dielectric coating is applied to the substrate by electrodeposition of an electrodepositable coating composition comprising a resinous phase dispersed in an aqueous medium, where the resinous phase has a covalently bonded halogen content of at least 1 percent by weight based on total weight of resin solids present in said resinous phase. Such electrodepositable coating compositions and methods of application for such compositions are described in detail in co-pending U.S. patent application Ser. Nos. 10/184,192 and 10/184,195.

Any of the previously described electrodepositable coating compositions can be electrophoretically applied to an electroconductive substrate (or substrate that has been rendered electroconductive as by metallization). The applied voltage for electrodeposition may be varied and can be, for example, as low as 1 volt to as high as several thousand volts, but typically between 50 and 500 volts. The current density is usually between 0.5 ampere and 5 amperes per square foot (0.5 to 5 milliamperes per square centimeter) and tends to decrease during electrodeposition indicating the formation of an insulating conformal film on all exposed surfaces of the substrate. After the coating has been applied by electrodeposition, it typically is cured, usually thermally cured at elevated temperatures ranging from 90° to 300° C. for a period of 1 to 40 minutes to form a conformal dielectric coating over all exposed surfaces of the substrate.

Generally, autophoresis, also referred to as chemiphoresis, is a coating process for depositing an organic coating on a metal surface from an acidic aqueous coating composition in a dip tank. The process involves the controlled release of metal ions from the substrate surface due to the low pH of the aqueous composition, thereby destabilizing the polymer dispersed in the aqueous in the immediate vicinity of the substrate to be coated. This causes coagulation of the polymer particles and deposition of the coagulated polymer onto the substrate surface. As the coating thickness increases, the deposition slows, resulting in an overall uniform coating thickness. See R. Lambourne et al., *Paint and Surface Coatings*, William Andrew Publishing, $2^{nd}$ ed., vol. 12 at p. 510. Examples of compositions suitable for use as autophoretically applied dielectric coatings include those described in detail in U.S. Pat. Nos. 4,310450 and 4,313,861.

After application of the dielectric coating, the dielectric coating can be removed in one or more predetermined locations to expose one or more sections of the substrate surface. The dielectric coating can be removed by a variety of methods, for example by ablation techniques. Such ablation typically is performed using a laser or by other conventional techniques, for example, mechanical drilling and chemical or plasma etching techniques.

Metallization typically is performed after the removal step by applying a layer of metal to all surfaces, allowing for the formation of metallized vias through the substrate (i.e., through vias) and/or to (but not through) the substrate or core (i.e., blind vias). Alternatively, metallization can be performed prior to the removal step, with additional metallization performed afterward if necessary. The metal applied in this metallization step can be any of the previously mentioned metals or alloys provided that said metals or alloys have sufficient conductive properties. Typically, the metal applied in the above-described metallization step is copper. The metal applied in any of the metallization steps employed in the processes of the present invention can be applied by conventional electroplating, seed electroplating, metal vapor deposition, or any other method providing a uniform metal layer as described above. The thickness of the metal layer is typically about 5 to 50 microns.

To enhance the adhesion of the metal layer to the dielectric coating, prior to the metallization step all surfaces can be treated with ion beam, electron beam, corona discharge or plasma bombardment followed by application of an adhesion promoter layer to all surfaces. The adhesion promoter layer can range from 50 to 5000 Angstroms thick and typically is a metal or metal oxide selected from chromium, titanium, nickel, cobalt, cesium, iron, aluminum, copper, gold, tungsten and zinc, and alloys and oxides thereof.

Also, prior to application of the dielectric coating, the substrate surface may be pretreated or otherwise prepared for the application of the dielectric material. For example, cleaning, rinsing, and/or treatment with an adhesion promoter prior to application of the dielectric may be appropriate.

After metallization, a photosensitive layer (formed from a "photoresist" or "resist" composition) is applied to the metal layer. Optionally, prior to application of the photosensitive layer the metallized substrate can be cleaned and pretreated; e. g., treated with an acid etchant to remove oxidized metal. The photosensitive layer can be a positive or negative photosensitive. The photosensitive layer typically has a thickness of about 2 to 50 microns and can be applied by any method known to those skilled in the photolithographic processing art. Additive or subtractive processing methods may be used to create the desired circuit patterns.

Suitable positive-acting photosensitive resins include any of those known to practitioners skilled in the art. Examples include dinitro-benzyl functional polymers such as those disclosed in U.S. Pat. No. 5,600,035, columns 3-15. Such resins have a high degree of photosensitivity. In one embodiment, the resinous photosensitive layer is a composition comprising a dinitro-benzyl functional polymer, typically applied by spraying. Nitrobenzyl functional polymers as known to those skilled in the art are also suitable.

In a separate embodiment, the photosensitive layer is an electrodepositable composition comprising a dinitrobenzyl functional polyurethane and an epoxy-amine polymer such as that described in Examples 3-6 of U.S. Pat. No. 5,600,035.

Negative-acting photoresists include liquid or dry-film type compositions. Liquid compositions may be applied by rolling application techniques, curtain application, or electrodeposition. Preferably, liquid photoresists are applied by electrodeposition, more preferably cationic electrodeposition. Electrodepositable compositions comprise an ionic, polymeric material which may be cationic or anionic, and may be selected from polyesters, polyurethanes, acrylics, and polyepoxides. Examples of photoresists applied by anionic electrodeposition are shown in U.S. Pat. No. 3,738,835. Photoresists applied by cationic electrodeposition are described in U.S. Pat. No. 4,592,816. Examples of dry-film photoresists include those disclosed in U.S. Pat. Nos. 3,469,982, 4,378,264, and 4,343,885. Dry-film photoresists are typically laminated onto the surface such as by application of hot rollers.

Note that after application of the photosensitive layer, the multi-layer substrate can be packaged at this point allowing for transport and processing of any subsequent steps at a remote location.

In a particular embodiment, the present invention is directed to a process for fabricating a multi-layer circuit assembly comprising (a) providing a substrate (such as any of the substrates described in detail above) at least one area of which comprises a plurality of vias, said area(s) having a via density of 500 to 10,000 holes per square inch (75 to 1,550 holes per square centimeter and typically at least 2500 holes per square inch (387.5 holes per square centimeter); (b) applying a resist (such as any of the photoresist compositions described in detail above) at predetermined locations on the substrate; (c) applying a dielectric coating (such as any of the dielectric coatings described in detail above) onto all surfaces of the substrate of step (b) except at locations covered by said resist; (d) removing said resist at predetermined locations (as by any of the methods discussed above); and (e) applying a layer of metal, for example, copper, to all surfaces of the substrate of step (d).

In any of the processes of the present invention, after the photosensitive layer is applied, a photo-mask having a desired pattern may be placed over the photosensitive layer and the layered substrate exposed to a sufficient level of a suitable actinic radiation source. As used herein, the term "sufficient level of actinic radiation" refers to that level of radiation which polymerizes the monomers in the radiation-exposed areas in the case of negative acting resists, or which depolymerizes the polymer or renders the polymer more soluble in the case of positive acting resists. This results in a solubility differential between the radiation-exposed and radiation-shielded areas.

The photo-mask may be removed after exposure to the radiation source and the layered substrate developed using conventional developing solutions to remove more soluble portions of the photosensitive layer, and uncover selected areas of the underlying metal layer. The metal which is uncovered during this step may then be etched using metal etchants that convert the metal to water-soluble metal complexes. The soluble complexes may be removed by water spraying.

The photosensitive layer protects any metal thereunder during the etching step. The remaining photosensitive layer, which is impervious to the etchants, may then be removed by a chemical stripping process to provide a circuit pattern connected by the metallized vias formed as described above.

The total thickness of the multi-layer circuit assembly after removal of the photosensitive layer is typically about 25 to 360 microns, preferably 35 to 210 microns.

In yet another embodiment, the present invention is directed to a process for fabricating a multi-layer circuit assembly comprising (a) providing a substrate (such as any of those described in detail above) at least one area of which comprises a plurality of vias, said area(s) having a via density of 500 to 10,000 holes/square inch (75 to 1550 holes/square centimeter), typically at least 2500 holes per square inch (387.5 holes per square centimeter); (b) applying a dielectric coating (such as any of those described in detail above) onto all exposed surfaces of the substrate to form a conformal coating thereon; (c) removing the dielectric coating (by any of the removal methods described above) in a predetermined pattern to expose sections of the substrate; (d) applying a layer of metal (by any of the above-described metallization techniques) to all surfaces to form metallized vias through and/or to the electrically conductive core; (e) applying a resist (such as any of the photosensitive compositions described above) to the metal layer to form a photosensitive layer thereon; (f) imaging said resist (as described above) in predetermined locations; (g) developing said resist (as described above) to uncover selected areas of the metal layer; and (h) etching (as described above) said uncovered areas of metal to form an electrical circuit pattern connected by the metallized vias.

It should be understood that any of the processes of the present invention can include one or more additional steps without departing from the scope of the inventor. Likewise, the order in which the steps are performed may be changed as necessary, without departing from the scope of the invention.

The present invention also is directed to multi-layer circuit assemblies fabricated by any of the previously described processes. In one embodiment the present invention is directed to a multi-layer circuit assembly comprising (a) substrate (such as any of those described above) at least one area of which comprises a plurality of vias, said area having a via density of 500 to 10,000 holes/square inch (75 to 1550 holes/square centimeter), typically at least 2500 holes/square inch (387.5 holes/square centimeter); (b) a dielectric coating (such as any dielectric coating previously described) applied onto all exposed surfaces of the substrate; (c) a layer of any of the previously described metals suitable for metallization, typically copper; and (d) a photosensitive layer (such as any of the previously described photosensitive compositions). Application of the dielectric coating the metal layer, and the photosensitive layer can be accomplished by any of the respective application methods described in detail above.

After preparation of the circuit pattern on the multi-layered substrate, other circuit components may be attached in one or more subsequent steps to form a circuit assembly. Additional components can include one or more multi-layer circuit assemblies prepared by any of the processes of the present invention, smaller scale components such as semiconductor chips, interposer layers, larger scale circuit cards or mother boards and active or passive components. Note that interposers used in the preparation of the circuit assembly may be prepared using appropriate steps of the process of the present invention. Components may be attached using conventional adhesives, surface mount techniques, wire bonding or flip chip techniques. High via density in the multi-layer circuit assembly prepared in accordance with the present invention allows for more electrical interconnects from highly functional chips to the packages in the assembly.

It will be appreciated by those skilled in the art that changes could be made to the embodiments described above without departing from the broad inventive concept thereof. It is understood, therefore, that this invention is not limited to the particular embodiments disclosed, but it is intended to cover modifications which are within the spirit and scope of the invention, as defined by the appended claims.

We claim:

1. A multi-layer circuit assembly comprising:
   a substrate at least one area of which comprises a plurality of vias, said area having a via density of 500 to 10,000 holes/square inch (75 to 1550 holes/square centimeter);
   a conformal dielectric coating applied onto all exposed surfaces of the substrate, wherein the conformal dielectric coating has a thickness of no more than 50 microns, and a dielectric constant of no more than 4.00;

a layer of metal applied to all surfaces of substrate of step (b); and a photosensitive layer applied to the metal layer.

2. The multi-layer circuit assembly of claim 1, wherein the substrate comprises an electrically conductive substrate.

3. The multi-layer circuit assembly of claim 1, wherein the dielectric coating has flame resistant properties in accordance with IPC-TM-650.

4. The multi-layer circuit assembly of claim 2, wherein the electrically conductive substrate comprises a metal selected from perforate copper foil, iron-nickel alloys, and combinations thereof.

5. The multi-layer circuit assembly of claim 1 wherein the substrate comprises a nickel-iron alloy.

6. The multi-layer circuit assembly of claim 5 further comprising an intervening layer of copper metal between the substrate and the dielectric coating.

7. The multi-layer circuit assembly of claim 1 wherein the dielectric coating is applied by vapor deposition.

8. The multi-layer circuit assembly of claim 7 wherein the dielectric coating is a poly(para-xylylene).

9. The multi-layer circuit assembly of claim 1 wherein the dielectric coating is applied by electrodeposition.

10. The multi-layer circuit assembly of claim 9, wherein the dielectric coating comprises a photosensitive composition.

11. The multi-layer circuit assembly of claim 1, wherein the dielectric coating is applied by autophoresis.

12. The multi-layer circuit assembly of claim 1 further comprising an adhesion promoter layer applied to all surfaces prior to application of the metal layer.

13. The multi-layer circuit assembly of claim 12, wherein the adhesion promoter layer comprises a metal or metal oxide selected from one or more of chromium, titanium, nickel, cobalt, cesium, iron, aluminum, copper, gold, zinc, and oxides thereof.

14. The multi-layer circuit assembly of claim 1, wherein the metal layer comprises a layer of copper.

15. The multi-layer circuit assembly of claim 1 wherein the photosensitive layer comprises a positive-acting photosensitive layer applied by electrodeposition.

16. The multi-layer circuit assembly of claim 1 wherein the substrate comprises a perforate metal substrate having a via density of at least 2500 holes/square inch (387.5 holes/square centimeter).

* * * * *